(12) United States Patent
Jang et al.

(10) Patent No.: US 8,599,328 B2
(45) Date of Patent: Dec. 3, 2013

(54) LIQUID CRYSTAL DISPLAY

(75) Inventors: Sae Sam Jang, Miryang-si (KR); Sung Won Chung, Asan-si (KR); Jae Hwan Chun, Suwon-si (KR); Jin Min Chung, Yongin-si (KR); Kyung Rok Ko, Suwon-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 167 days.

(21) Appl. No.: 13/192,021

(22) Filed: Jul. 27, 2011

(65) Prior Publication Data

US 2012/0236227 A1      Sep. 20, 2012

(30) Foreign Application Priority Data

Mar. 15, 2011      (KR) .................. 10-2011-0022853

(51) Int. Cl.
*G02F 1/1333*      (2006.01)

(52) U.S. Cl.
USPC .......................................................... 349/58

(58) Field of Classification Search
USPC .......................................................... 349/58
See application file for complete search history.

(56) References Cited

U.S. PATENT DOCUMENTS 7,525,627 B2 *   4/2009   Azuma et al. .................. 349/150
7,692,732 B2 *   4/2010   Tsubokura et al. ............. 349/58

FOREIGN PATENT DOCUMENTS

| JP | 08-236926 | 9/1996 |
|----|-----------|--------|
| JP | 3820711 | 6/2006 |
| JP | 3159036 U | 4/2010 |
| KR | 20-0170551 Y1 | 2/2000 |
| KR | 1020050005167 | 1/2005 |
| KR | 1020060054809 | 5/2006 |
| KR | 100973742 | 7/2010 |

* cited by examiner

*Primary Examiner* — James Dudek
(74) *Attorney, Agent, or Firm* — F. Chau & Associates, LLC

(57) ABSTRACT

A liquid crystal display includes a liquid crystal panel displaying images, a plurality of gate circuit chips-on-film connected to the liquid crystal panel and supplying gate driving signals to the liquid crystal panel, a plurality of data circuit chips-on-film connected to the liquid crystal panel and supplying data driving signals to the liquid crystal panel, a gate printed circuit board (PCB) connected to the gate circuit chips-on-film, a data printed circuit board (PCB) connected to the data circuit chips-on-film, a backlight assembly supplying light to the liquid crystal panel, and a top chassis fixing the liquid crystal panel and the backlight assembly, and including an upper surface and a lower surface, wherein the data printed circuit board (PCB) is disposed corresponding to the lower surface of the top chassis, and a plurality of drain holes are disposed in the lower surface of the top chassis.

17 Claims, 3 Drawing Sheets

LIQUID CRYSTAL DISPLAY

CROSS-REFERENCE TO RELATED APPLICATION

This application claims priority to and the benefit of Korean Patent Application No. 10-2011-0022853 filed in the Korean Intellectual Property Office on Mar. 15, 2011, the entire contents of which are incorporated herein by reference.

BACKGROUND OF THE INVENTION (a) Technical Field

The present invention relates to a liquid crystal display.

(b) Discussion of the Related Art

A liquid crystal display may include two display panels having electric field generating electrodes, and a liquid crystal layer having dielectric anisotropy interposed between the two display panels. In operation, the liquid crystal display applies a voltage to the electric field generating electrodes to generate an electric field in the liquid crystal layer, and adjusts the intensity of the electric field to adjust transmittance of light passing through the liquid crystal layer to thereby obtain a desired image.

A liquid crystal display may include a liquid crystal panel displaying an image, a printed circuit board (PCB) supplying image signals to the liquid crystal panel, and a backlight assembly supplying light to the liquid crystal panel.

When foreign particles are included on the liquid crystal panel displaying the image, a cleaning solution may be used to remove the foreign particles. When cleaning the liquid crystal panel, the cleaning solution may seep into the printed circuit board (PCB) such that corrosion of the printed circuit board (PCB) may occur.

SUMMARY OF THE INVENTION

The embodiments of the present invention relate to a liquid crystal display that prevents corrosion of a printed circuit board (PCB) due to a cleaning solution used when cleaning a liquid crystal panel.

A liquid crystal display, according to an exemplary embodiment of the present invention, includes a liquid crystal panel displaying images, a plurality of gate circuit chips-on-film connected to the liquid crystal panel and supplying gate driving signals to the liquid crystal panel, a plurality of data circuit chips-on-film connected to the liquid crystal panel and supplying data driving signals to the liquid crystal panel, a gate printed circuit board (PCB) connected to the gate circuit chips-on-film, a data printed circuit board (PCB) connected to the data circuit chips-on-film, a backlight assembly supplying light to the liquid crystal panel, and a top chassis fixing the liquid crystal panel and the backlight assembly and including an upper surface and a lower surface, wherein the data printed circuit board (PCB) is disposed corresponding to the lower surface of the top chassis, and a plurality of drain holes are disposed in the lower surface of the top chassis.

Each drain hole may be disposed at a location corresponding to a data circuit chip-on-film.

A plurality of moisture permeation prevention members may be disposed on the data printed circuit board (PCB).

Each moisture permeation prevention member may be disposed corresponding to a data circuit chip-on-film.

An absorption member and a static electricity prevention member may be disposed on the data circuit chips-on-film.

The absorption member and the static electricity prevention member may be disposed on portions of the data IC chips-on-film attached to the liquid crystal panel.

The static electricity prevention member may be disposed on opposite sides of the absorption member, and a space between the static electricity prevention member and the absorption member may be less than 0.5 mm.

The absorption member may comprise a non-woven fabric, and the static electricity prevention member may comprise a conductive rubber.

A liquid crystal display, according to an exemplary embodiment of the present invention, comprises a liquid crystal panel, a plurality of circuit chips-on-film connected to the liquid crystal panel, and positioned along a lower side of the of the liquid crystal panel, a printed circuit board (PCB) connected to the circuit chips-on-film, a backlight assembly, and a top chassis fixing the liquid crystal panel and the backlight assembly, and including an upper surface and a lower surface, wherein the printed circuit board (PCB) is disposed corresponding to the lower surface of the top chassis, and a plurality of drain holes are disposed in the lower surface of the top chassis.

A chassis for fixing a display panel and a backlight assembly of a display device, according to an exemplary embodiment of the present invention, comprises an upper surface, and a lower surface including a plurality of drain holes disposed in the lower surface, wherein the lower surface is positioned to correspond to a position of a plurality of circuit chips-on-film connected to the display panel, and to a printed circuit board (PCB) connected to the circuit chips-on-film.

According to exemplary embodiments of the present invention, the drain holes of the top chassis are formed, and the moisture permeation prevention members are formed on the printed circuit board (PCB) or the absorption member is formed on the liquid crystal panel, such that the corrosion of the printed circuit board (PCB) due to a cleaning solution or other liquid may be prevented.

DETAILED DESCRIPTION OF THE EMBODIMENTS

Figure 1:
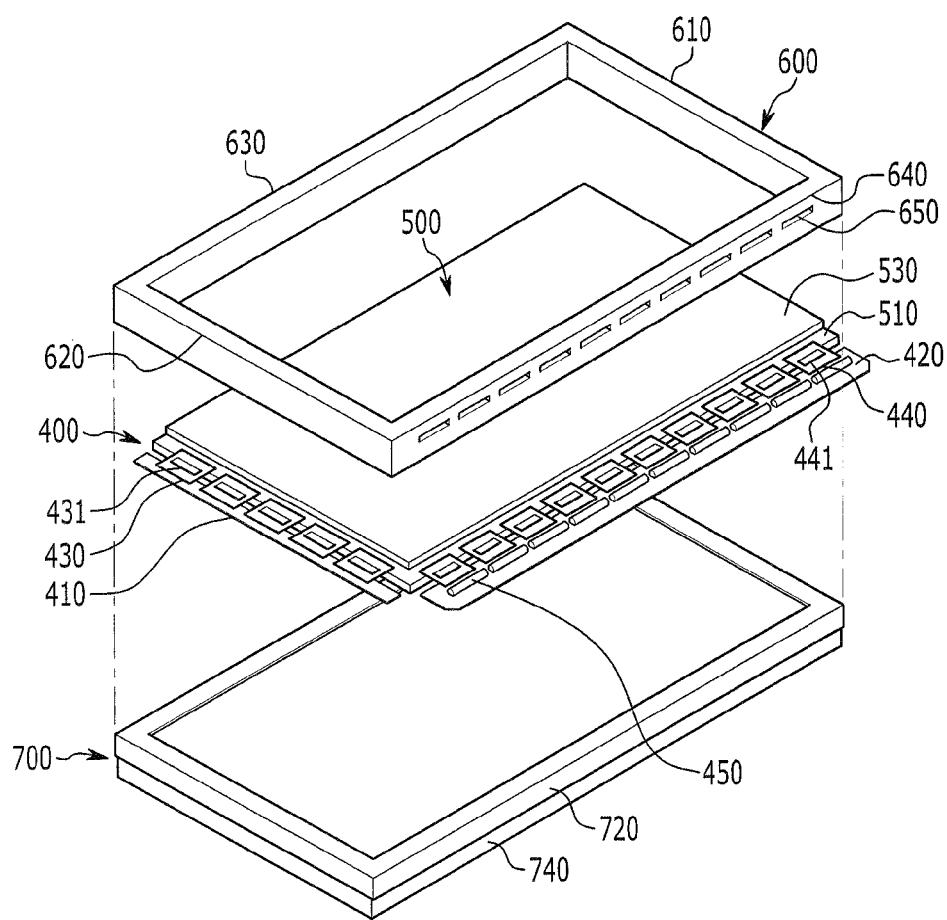
FIG. 1 is an exploded perspective view of a liquid crystal display, according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., may be exaggerated for clarity. Like reference numerals may designate like elements throughout the specification. It will be understood that when an element such as a layer, film, region, or substrate is referred to as being "on"

another element, it can be directly on the other element or intervening elements may also be present.

Figure 2:
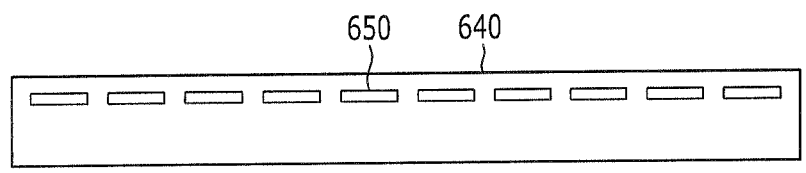
FIG. 2 is a plan view of a lower surface of a top chassis, according to an exemplary embodiment of the present invention.
Figure 3:
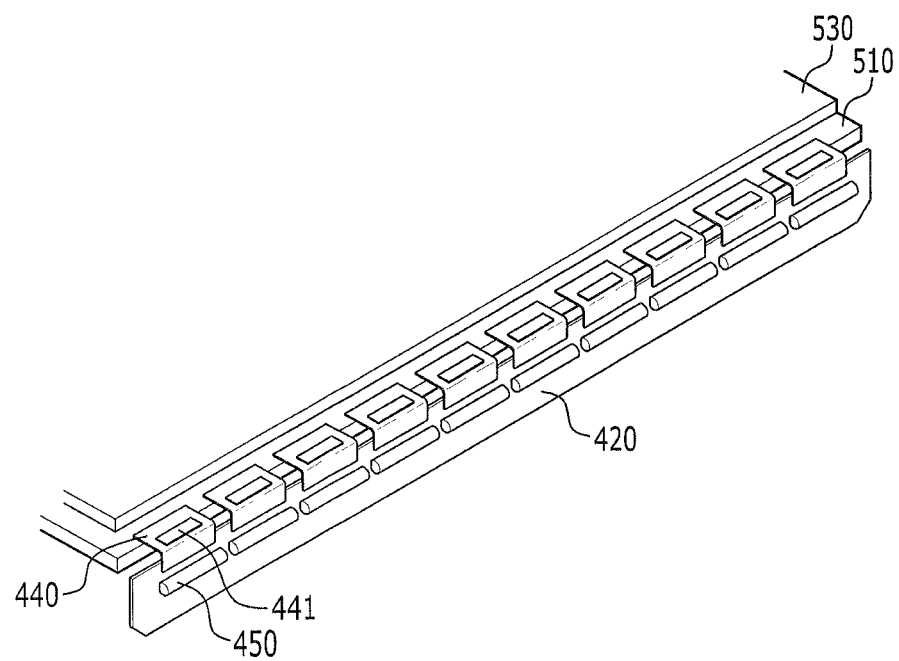
FIG. 3 is a perspective view of a data printed circuit board (PCB) that is bent, according to an exemplary embodiment of the present invention.

FIG. 1 is an exploded perspective view of a liquid crystal display according to an exemplary embodiment of the present invention, FIG. 2 is a plan view of a lower surface of a top chassis, and FIG. 3 is a perspective view of a data printed circuit board (PCB) that is bent.

As shown in FIG. 1 to FIG. 3, a liquid crystal display according to an exemplary embodiment of the present invention includes a backlight assembly 700 supplying light to a liquid crystal panel 500, and a liquid crystal panel assembly 400 displaying images corresponding to the light. A top chassis 600 fixing and supporting the liquid crystal panel assembly 400 and the backlight assembly 700 is provided on the liquid crystal panel assembly 400.

The top chassis 600 includes sides 610 and 620, an upper surface 630, and a lower surface 640. The lower surface 640 includes a plurality of drain holes 650.

The liquid crystal panel assembly 400 includes a liquid crystal panel 500, a gate IC chip-on-film (COF) 430 connected to the liquid crystal panel 500 and supplying a gate driving signal, a data IC chip-on-film (COF) 440 supplying a data driving signal, a gate printed circuit board (PCB) 410, and a data printed circuit board (PCB) 420.

The liquid crystal panel 500 includes a thin film transistor panel 510 formed with a plurality of thin film transistors and a color filter panel 530 disposed on the thin film transistor panel 510, and liquid crystal (not shown) is positioned between the two panels.

The thin film transistor panel 510 is, for example, a transparent glass substrate formed with thin film transistors in a matrix shape. A thin film transistor includes a source terminal connected to a data line and a gate terminal connected to a gate line. Also, a drain terminal of the thin film transistor is connected to a pixel electrode made of, for example, a transparent conductive material, such as indium tin oxide (ITO).

When a gate line and the data line of the above-described liquid crystal panel 500 are input with an electrical signal from the gate printed circuit board (PCB) 410 and the data printed circuit board (PCB) 420, respectively, the source terminal and the gate terminal of a thin film transistor are input with the electrical signals, and the thin film transistor is turned on or turned off according to the input of the electrical signals such that the electrical signal for pixel formation is output to the drain terminal.

A color filter panel 530 is diposed facing the thin film transistor panel 510. The color filter panel 530 is a substrate on which red, green, blue (RGB) pixels, which are color pixels expressing predetermined colors when light passes through the color pixels, are formed by a thin film process. A common electrode formed of a transparent electrode such as ITO is provided on a whole surface of the substrate forming the color filter panel, for example an entire top surface of the substrate. When a thin film transistor is turned on by applying power to the gate terminal and the source terminal of the thin film transistor, an electric field is formed between the pixel electrode and the common electrode of the color filter panel. An alignment angle of the liquid crystal disposed between the thin film transistor panel 510 and the color filter panel 530 is changed by the electric field and light transmittance is changed according to the changed alignment angle, thereby making it possible to obtain the desired pixel images.

The gate printed circuit board (PCB) 410 and the data printed circuit board (PCB) 420 receive the image signals from outside of the liquid crystal panel 500, and apply the driving signals to the gate line and the data line, respectively connected to the gate IC chip-on-film 430 and the data IC chip-on-film 440 attached to the liquid crystal panel 500.

The gate printed circuit board (PCB) 410 and the data printed circuit board (PCB) 420 generate gate driving signals and data driving signals, respectively, to drive the liquid crystal display and generate a plurality of driving signals to apply the gate driving signals and the data driving signals at appropriate times, and respectively apply the gate driving signals and the data driving signals to the gate lines and the data lines of the liquid crystal panel 500. The gate driving signals and the data driving signals are applied through the gate IC chip-on-films 430 and the data IC chip-on-films 440 respectively mounted with gate driver IC chips 431 and data driver IC chips 441.

The data printed circuit board (PCB) 420 includes a plurality of moisture permeation prevention members 450 preventing a cleaning solution, or any other type of liquid, from seeping into a circuit of the data printed circuit board (PCB) 420.

The backlight assembly 700 providing uniform light to the liquid crystal panel assembly 400 is disposed under the liquid crystal panel 500.

The backlight assembly 700 includes a bottom chassis 740 receiving a light source (not shown), and a mold frame 720 fixing an optical sheet (not shown). The optical sheet(s) obtaining a luminance characteristic of the light and provide the light to the liquid crystal panel 500.

The top chassis 600 prevents the liquid crystal panel assembly 400 from being released from the bottom chassis 740. The gate printed circuit board (PCB) 410 and the data printed circuit board (PCB) 420 are respectively bent along side 620 and lower surface 640 toward outside the mold frame 720.

The backlight assembly 700, the liquid crystal panel assembly 400, and the top chassis 600 are assembled, and thereby the lower surface 640 of the top chassis 600 is disposed to be toward the lower side when the display device is oriented in a viewing position. The data printed circuit board (PCB) 420 is positioned corresponding to the lower surface 640 of the top chassis 600.

The drain holes 650 are formed at the lower surface 640 of the top chassis 600 such that the cleaning solution for cleaning the liquid crystal panel 500, or any other liquid applied to the liquid crystal panel, does not remain at the lower surface 640 of the top chassis 600, but, instead. is drained through the drain holes 650. Each drain hole 650 is positioned corresponding to a data IC chip-on-film 440.

The moisture permeation prevention members 450 formed on the data printed circuit board (PCB) 420 prevent the cleaning solution for cleaning the liquid crystal panel 500, or any other liquid applied to the liquid crystal panel, from seeping into the circuits of the data printed circuit board (PCB) 420. Each moisture permeation prevention member 450 is positioned corresponding to a data IC chip-on-film 440. The moisture permeation prevention members 450 include, for example, protrusions which divert liquid away from the circuits of the data printed circuit board 420.

According to embodiments of the present invention, a plurality of drain holes 650 are formed at the lower surface 640 of the top chassis 600, and a plurality of moisture permeation prevention members 450 are formed on the data printed circuit board (PCB) 420 such that the display quality deterioration that might be caused by the cleaning solution for cleaning the liquid crystal panel 500, or other liquids, may be prevented.

Figure 4:
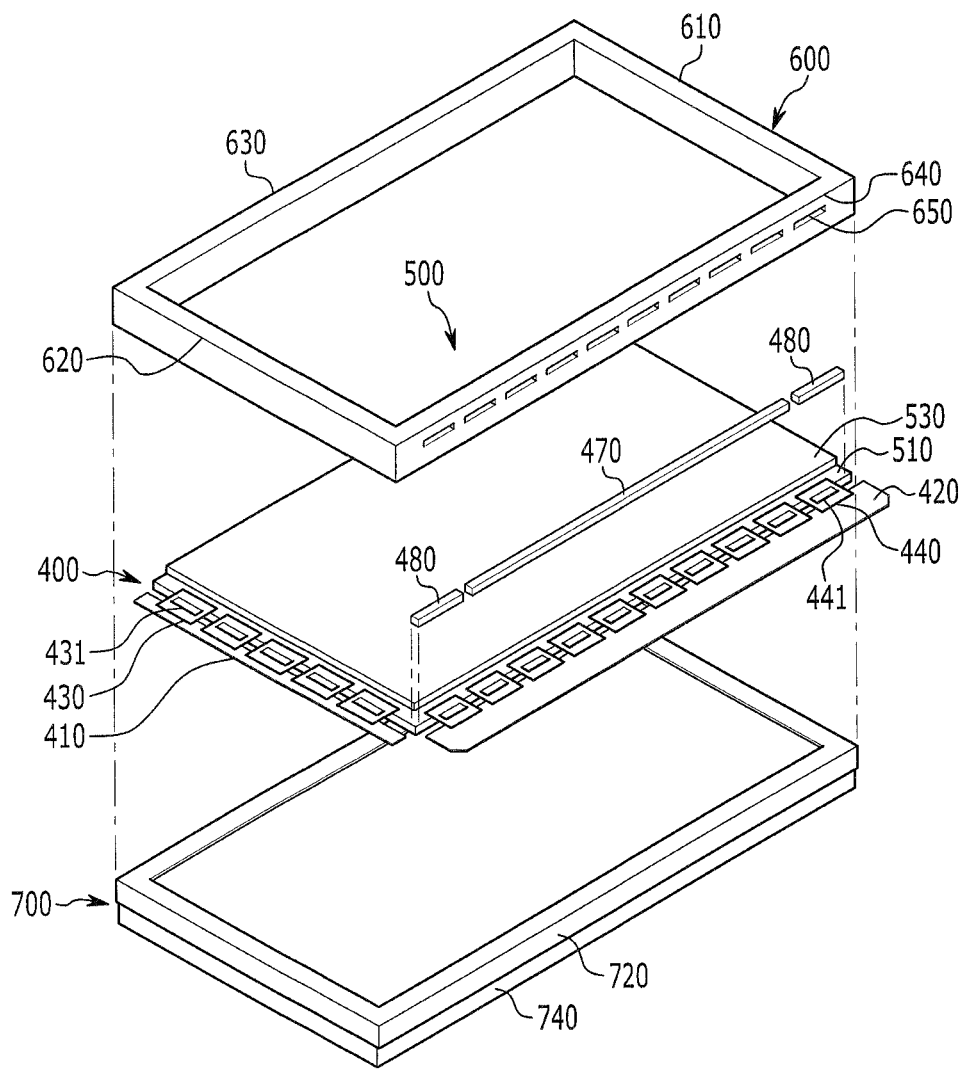
FIG. 4 is a perspective view of a liquid crystal display according to an exemplary embodiment of the present invention.

FIG. 4 is a perspective view of a liquid crystal display according to an exemplary embodiment of the present invention.

As shown in FIG. 4, a liquid crystal display according to this exemplary embodiment of the present invention is the same as the liquid crystal display of FIG. 1 except that the moisture permeation prevention members 450 are not formed on the data printed circuit board (PCB) 420, and an absorption member 470 and a static electricity prevention member 480 are formed.

The absorption member 470 and the static electricity prevention member 480 are attached to the inner side of the lower surface 640 of the top chassis 600 by an adhesive and are positioned on the data IC chips-on-film 440. More specifically, the absorption member 470 and the static electricity prevention member 480 are positioned on portions of the data IC chips-on-film 440 that are attached to the liquid crystal panel 500.

The length and width of the absorption member 470 and the static electricity prevention member 480 may be varied according to the size of the liquid crystal panel 500, and the static electricity prevention member 480 is positioned at opposite sides of the absorption member 470 and spaced apart from the absorption member 470 at a distance of less than 0.5 mm.

The absorption member 470 comprises a moisture absorption material such as a non-woven fabric to absorb the cleaning solution for cleaning the liquid crystal panel 500, or other liquid, thereby preventing the cleaning solution or other liquid from seeping into the circuit of the data printed circuit board (PCB) 420.

The static electricity prevention member 480 comprises a conductive rubber, thereby preventing static electricity generation of the liquid crystal display.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A liquid crystal display comprising:
    a liquid crystal panel;
    a plurality of gate circuit chips-on-film connected to the liquid crystal panel;
    a plurality of data circuit chips-on-film connected to the liquid crystal panel;
    a gate printed circuit board (PCB) connected to the gate circuit chips-on-film;
    a data printed circuit board (PCB) connected to the data circuit chips-on-film;
    a backlight assembly; and
    a top chassis fixing the liquid crystal panel and the backlight assembly, and including an upper surface and a lower surface,
    wherein the data printed circuit board (PCB) is disposed corresponding to the lower surface of the top chassis, and
    a plurality of holes are disposed in the lower surface of the top chassis, wherein each hole is disposed corresponding to a data circuit chip-on-film.

2. The liquid crystal display of claim 1, further comprising a plurality of moisture permeation prevention members disposed on the data printed circuit board (PCB).

3. The liquid crystal display of claim 2, wherein each moisture permeation prevention member is disposed corresponding to a data circuit chip-on-film.

4. The liquid crystal display of claim 1, further comprising an absorption member and a static electricity prevention member disposed on the data circuit chips-on-film.

5. The liquid crystal display of claim 4, wherein the absorption member and the static electricity prevention member are disposed on portions of the data circuit chips-on-film attached to the liquid crystal panel.

6. The liquid crystal display of claim 5, wherein the static electricity prevention member is disposed on opposite sides of the absorption member, and a space between the static electricity prevention member and the absorption member is less than 0.5 mm.

7. The liquid crystal display of claim 4, wherein the absorption member comprises a non-woven fabric, and the static electricity prevention member comprises a conductive rubber.

8. A liquid crystal display comprising:
    a liquid crystal panel;
    a plurality of circuit chips-on-film connected to the liquid crystal panel, and positioned along a lower side of the of the liquid crystal panel;
    a printed circuit board (PCB) connected to the circuit chips-on-film;
    a backlight assembly; and
    a top chassis fixing the liquid crystal panel and the backlight assembly, and including an upper surface and a lower surface,
    wherein the printed circuit board (PCB) is disposed corresponding to the lower surface of the top chassis, and
    a plurality of holes are disposed in the lower surface of the top chassis, wherein each hole is disposed corresponding to a circuit chip-on-film.

9. The liquid crystal display of claim 8, further comprising a plurality of moisture permeation prevention members disposed on the printed circuit board (PCB).

10. The liquid crystal display of claim 9, wherein each moisture permeation prevention member is disposed corresponding to a circuit chip-on-film.

11. The liquid crystal display of claim 8, further comprising an absorption member and a static electricity prevention member disposed on the circuit chips-on-film.

12. The liquid crystal display of claim 11, wherein the absorption member and the static electricity prevention member are disposed on portions of the circuit chips-on-film attached to the liquid crystal panel.

13. The liquid crystal display of claim 12, wherein the static electricity prevention member is disposed on opposite sides of the absorption member, and a space between the static electricity prevention member and the absorption member is less than 0.5 mm.

14. The liquid crystal display of claim 11, wherein the absorption member comprises a non-woven fabric, and the static electricity prevention member comprises a conductive rubber.

15. A chassis for fixing a display panel and a backlight assembly of a display device, the chassis comprising:
    an upper surface; and
    a lower surface including a plurality of holes disposed in the lower surface, wherein the lower surface is positioned to correspond to a position of a plurality of circuit chips-on-film connected to the display panel, and to a printed circuit board (PCB) connected to the circuit chips-on-film, wherein each hole is disposed corresponding to a circuit chip-on-film.

16. The chassis of claim 15, further comprising an absorption member and a static electricity prevention member disposed on an inner side of the lower surface.

17. The chassis of claim 16, wherein the static electricity prevention member is disposed on opposite sides of the absorption member, and a space between the static electricity prevention member and the absorption member is less than 0.5 mm.

* * * * *